(12) United States Patent
Vesamäki et al.

(10) Patent No.: US 6,385,054 B1
(45) Date of Patent: May 7, 2002

(54) ELECTRONIC DEVICE

(75) Inventors: Seppo Vesamäki, Tampere; Timo T. Laitinen, Viiala; Petri Kotilainen; Mika Isotalo, both of Tampere, all of (FI)

(73) Assignee: Nokia Mobil Phones Ltd., Espoo (FI)

( * ) Notice: Subject to any disclaimer, the term of this patent is extended or adjusted under 35 U.S.C. 154(b) by 0 days.

(21) Appl. No.: 09/451,521

(22) Filed: Nov. 30, 1999

(30) Foreign Application Priority Data

Nov. 30, 1998 (FI) .................................................. 982586

(51) Int. Cl.[7] .................................................. H05K 9/00
(52) U.S. Cl. ........................ 361/816; 361/752; 361/800; 361/818; 174/35 R
(58) Field of Search ................................. 361/752, 753, 361/799, 816, 818, 800–803, 767, 769; 379/433; 455/90, 300; 174/35 R

(56) References Cited

U.S. PATENT DOCUMENTS

| | | | |
|---|---|---|---|
| 4,683,519 A | 7/1987 | Murakami | 361/424 |
| 4,794,489 A * | 12/1988 | Brown | 361/816 |
| 5,265,265 A | 11/1993 | Hama et al. | 455/300 |
| 5,590,028 A * | 12/1996 | Duncan | 361/737 |
| 5,822,192 A * | 10/1998 | Hayashi | 361/752 |
| 5,907,471 A | 5/1999 | Patel et al. | 361/500 |

\* cited by examiner

*Primary Examiner*—Jayprakash N. Gandhi
(74) *Attorney, Agent, or Firm*—Perman & Green, LLP

(57) ABSTRACT

An electronic device (10), comprising at least one circuit board (11); an interference screen (30) to be connected to said circuit board; and a power supply (20) comprising a first terminal (21) and a second terminal (22). The device is characterized in that said screen (30) comprises means (35) for fixing the power supply (20) to the screen (30) in such a way that an electrical connection is established between the screen (30) and the first terminal (21) of the power supply (20). The arrangement of the device facilitates the reliable fixing of a power supply and saves space on a circuit board in a way suited for mass production.

13 Claims, 4 Drawing Sheets

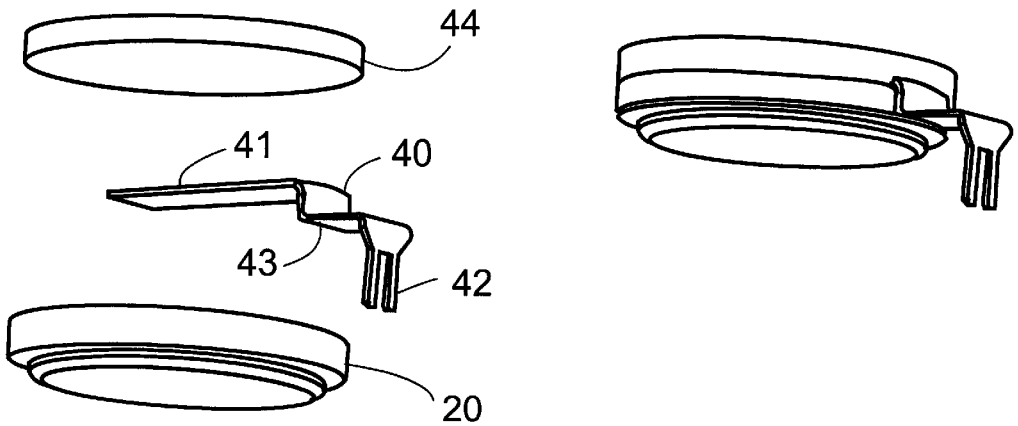
FIG 4a                    FIG 4b
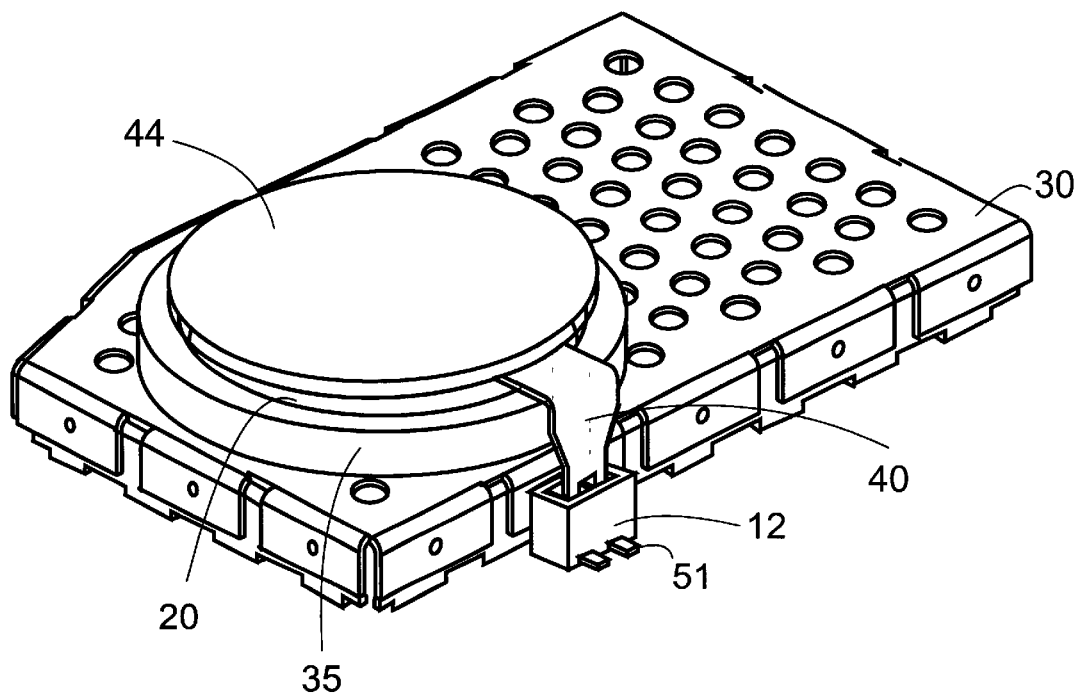
FIG 5

ELECTRONIC DEVICE

FIELD OF THE INVENTION

The present invention relates to electronic devices, and in particular to an electronic device comprising at least one circuit board, an interference screen fixed to said circuit board, and a power source comprising a first and a second terminal. The invention relates also to an interference screen for improving the electromagnetic compatibility of said electronic device.

BACKGROUND OF THE INVENTION

When the features of electronic devices are compared, the fact that a device takes little room, is comfortable to carry and operates without failures also in demanding operating conditions, has become a significant factor. Because devices also are supposed, however, to perform all the time more and more complicated tasks, fitting the components contained in a device into a desired space is a challenging task requiring complicated optimizing. In order to keep prices under control, the solutions should also be suitable for mass production as far as possible.

A component that makes optimizing difficult is the power supply supplying to a device the power required for operating. For example in mobile stations the device comprises, in addition to a large rechargeable battery, also a smaller back-up power supply for securing the power supply to continuously maintained functions even when the actual battery is discharged. Compared with other electronic components, a back-up power supply is large and thus takes up a lot of space when installed on a circuit board.

Furthermore, a back-up power supply does not necessarily endure the temperature in a reflow-oven, and thus it often has to be mounted on a circuit board only after the oven treatment. This kind of solution is used e.g. in communicator model Nokia 9000, in which the protruding terminals of the power supply are soldered manually directly on the circuit board. The method provides a good result, but unnecessarily complicates the manufacturing process.

In certain consumer electronics devices and for example in Nokia 9110 model communicators it has been arranged directly on the circuit board a stackable metal holder, into which a battery used as a back-up power supply can be slipped in assembly stage after oven treatment, i.e. the manual soldering stage impeding production is not required. Such a solution is more functional from the production and maintenance point of view, but it still takes up relatively much space on a circuit board.

SUMMARY OF THE INVENTION

Now it has been invented an electronic device, where the effect of the above problems has been significantly reduced. According to a first aspect of the invention there is provided an electronic device, comprising
 at least one circuit board;
 an interference screen to be connected to said circuit board;
 a power supply, comprising a first terminal and a second terminal;
wherein
 said interference screen comprises means for fixing the power supply, to the interference screen in such a way that an electrical connection is formed between the interference screen and the first terminal of the power supply.

According to a second aspect of the invention there is provided an electronic device, comprising:
 at least one circuit board;
 an interference screen arranged to be fixed to said circuit board;
 a battery, comprising a first terminal and a second terminal; and
 a holder for holding the battery in relation to the interference screen so that an electrical coupling is formed between the interference screen and the first terminal.

By using a solution according to the invention it is possible to mount a power supply in a device without unnecessarily taking up space on the circuit board comprising the equipment. The solution is well suited for series production, and as there are no soldered connections, it also makes the servicing of the power supply easier. In the invention the mounting of the power supply utilizes a fixed construction, made of conductive material, used for protecting the device from electromagnetic interference. By using the construction the power supply is fixed in a desired place, and at the same time the power supply is connected via said construction to a desired potential.

In a solution according to the invention it is utilized the mechanical properties of the screen for fixing the power supply in place and the conductive properties of the screen to establish the electrical connection of the power supply. For example in mobile stations it is possible to utilize the invention and place a back-up power supply outside a circuit board and thus significantly save space on the circuit board. The attaching of a power supply is based upon pressing constructional parts against each other, and thus a power supply can be stacked in place in the assembly stage of a device and the power supply need not be soldered in place. When servicing, the arrangement is easy to dismantle and reassemble, and accordingly e.g. a damaged power supply is easy to replace.

An object of the invention is also an interference screen according to claim 12 for improving the electromagnetic compatibility of an electronic device. Said electronic device comprises at least one circuit board; and a power supply comprising a first terminal and a second terminal, wherein the screen comprises a fixing part for fixing a power supply to the screen in such a way that an electrical connection is formed between the screen and the first terminal of the power supply.

BRIEF DESCRIPTION OF THE DRAWINGS

The invention is explained in the following in detail with reference to enclosed figures, of which

FIG. 4*a* shows an exploded view which illustrates an arrangement according to FIG. 4*b* for connecting one of the terminals of a back-up power supply to a circuit board comprising the equipment;

FIG. 5 shows an arrangement according to the invention with the back-up battery in place.

DETAILED DESCRIPTION

Figure 1:
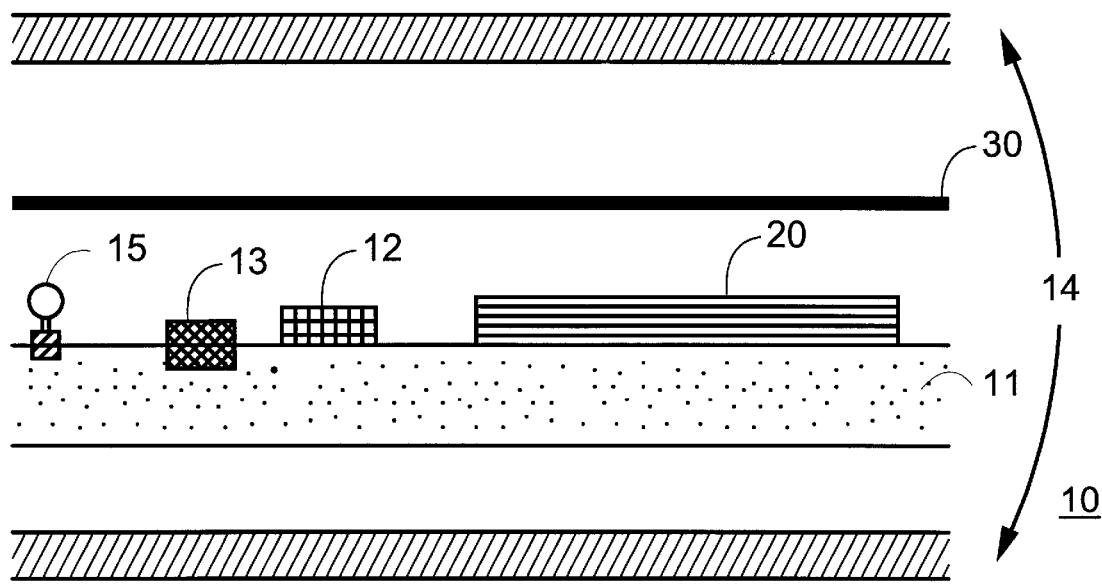
FIG. 1 shows a simplified figure of the cross section of mobile station 10 according to prior art.

As a first embodiment of the device according to the invention it is used a mobile station, however, without limiting the invention to said device or to the terminology used. FIG. 1 shows a simplified figure of the cross section of mobile station 10 according to prior art. The construction of a mobile station typically comprises equipment arranged on at least one circuit board 11, the equipment comprising, in addition to normal components 15 and circuitry, connectors 12 or terminal lugs 13 arranged on the circuit board for implementing the output and input functions of the circuit board. The construction of circuit board 11 is an application-specific choice comprising for example a conventional solid printed circuit board or a flexible foil construction comprising the necessary circuits. The construction further comprises housing 14 for protecting the equipment from external strain and screen 30 for reducing electromagnetic emission. In order to secure the power supply to the circuit board the construction also comprises back-up power supply 20 that in FIG. 1 is shown according to prior art, mounted on a circuit board.

Figure 2:
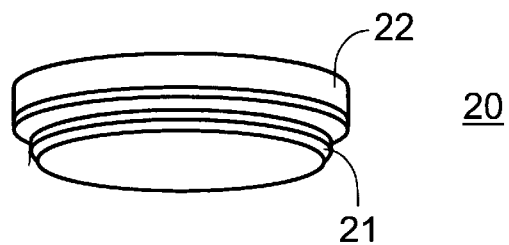
FIG. 2 shows a typical battery used as a back-up power supply.

FIG. 2 shows a typical battery used as a back-up power supply, comprising first terminal 21 and second terminal 22. In the example in FIG. 2 first terminal 21 is the negative terminal of the battery and second terminal 22 is the positive terminal of the battery. The form of the positive terminal of battery 22 is a flat disc and the form of the negative terminal of battery 21 is a flat disc slightly smaller in diameter with its edges rounded in such a way that the diameter of the surface on the positive terminal side of the disc is bigger than on the opposite side.

Achieving a type approval requires meeting certain requirements set by authorities on the devices. One of such requirements is the electromagnetic compatibility, EMC, that represents the capability of a device or a system to operate satisfactorily in its electromagnetic environment without inducing intolerable electromagnetic interference in its environment. It is a common solution in electronic devices to place as the protection of a circuit board or boards a construction made of conductive material, preferably of metal, which construction both protects the circuit board against external emission and reduces the emission emitted in the environment by the device itself.

Figure 3:
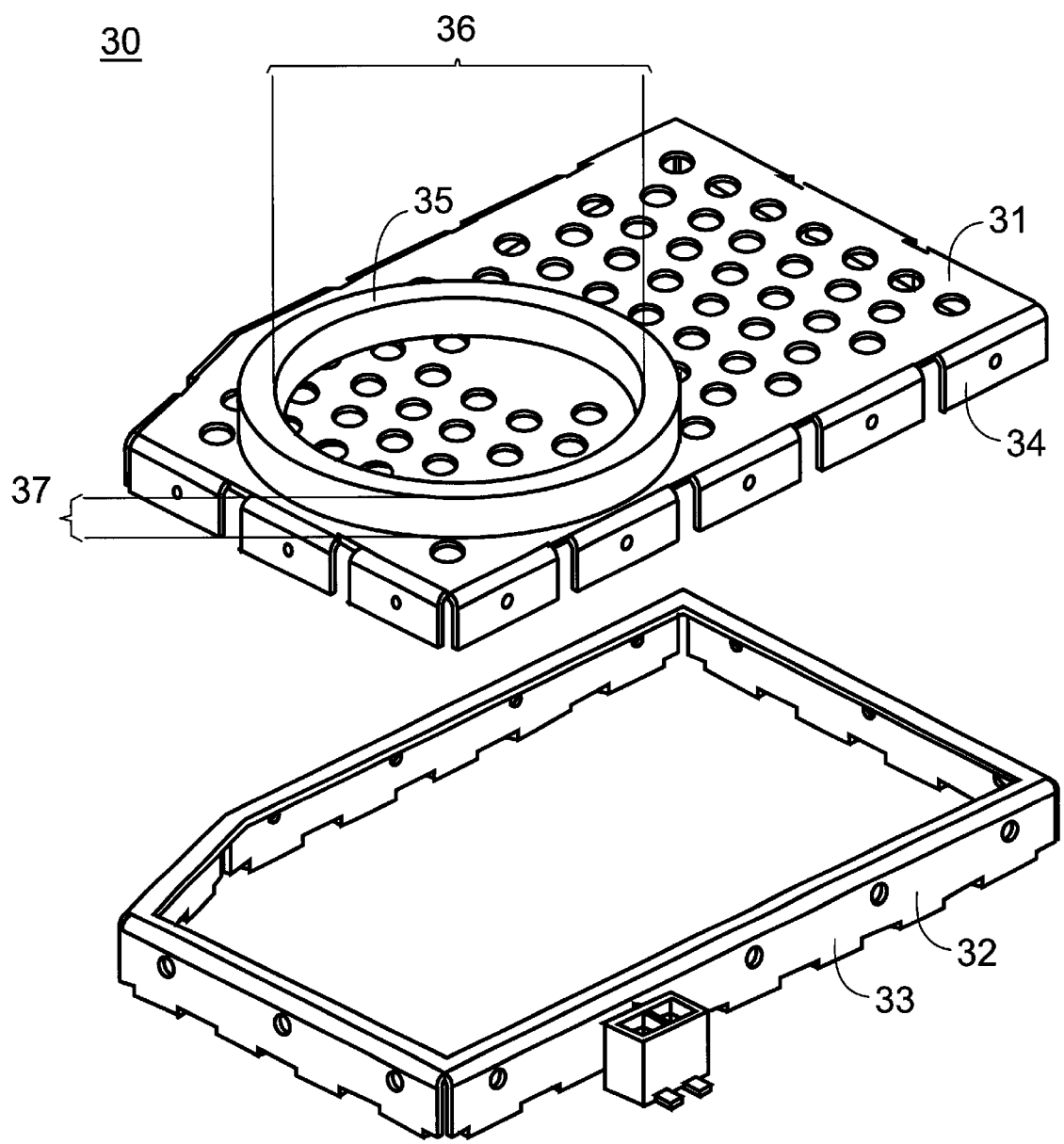
FIG. 3 illustrates an interference screen according to the invention.

FIG. 3 shows interference screen 30 according to the invention, which screen has been adapted to be placed in connection with the equipment of an electronic device, for example a circuit board, to reduce interfering electromagnetic radiation. Said screen 30 has a construction made of electrically conductive material, which in the embodiment shown in FIG. 3 comprises frame part 32 to be fixed to a circuit board and can-part 31 to be placed on top of the former. The shown two-part arrangement makes service and assembly operations easier without causing additional requirements on the mutual fixing construction between the circuit board and the screen. An interference screen according to the invention may also consist of one or more structural components.

An interference screen according to the presented embodiment comprises structural arrangement 33 for fixing the screen to a circuit board and for connecting the screen to a certain potential when the screen has been fixed to the equipment, thus making the servicing and assembly stages of the device easier. It is also possible to fix the screen to a circuit board using other methods, for example by soldering directly on a circuit board.

Can-part 31 comprises one or more clamps 34 following the form of frame part 32, said clamps enabling the fixing of the can-part to the frame part. In the presented embodiment the bent side wall of the can-part forms clamp 34, as shown in FIG. 3. In the case of the example shown in FIG. 3 the interference screen is, when fixed in place, connected to the ground potential of the equipment.

A screen according to the invention further comprises holder 35 that makes it possible to fix a battery firmly to the screen. In the example shown in FIG. 3 holder 35 is formed by a ring, connected rigidly to the screen and following the form of positive terminal 22 of battery 20. The inner diameter of holder 36 has been adapted in such a way that the battery fits inside the holder but cannot substantially move inside the holder. The height of the holder 37 has preferably been adapted in such a way that when the battery is inside the holder, the top surface of positive terminal 22 remains above the top edge of the holder. When battery 20 is placed inside holder 35, negative terminal 21 of the battery goes into contact with the conductive construction of screen 30, resulting in an electric connection between the negative terminal and the screen. In the example in FIG. 3 the negative terminal is connected to ground potential. Holder 35 is preferably made of electrically insulating material.

The exploded view in FIG. 4a illustrates an arrangement according to FIG. 4b for connecting one of the terminals of a back-up battery to a circuit board comprising the equipment. The object of the arrangement is to connect to one of the terminals of a back-up battery a terminal lug extending from one terminal to a contact point arranged on the circuit board and thus making an electric connection between the battery and the circuit board. In the example shown in FIG. 4a, to positive terminal 22 of battery 20 according to FIG. 2 terminal lug 40 has been fixed, the lug being formed of conductive material essentially keeping its form, preferably of metal. In this case the terminal lug consists of formed metal strip 40 comprising first end 41 to be set on the flat top surface of positive terminal 22, second end 42 adapted to be fixed to a connector arranged in the circuit board and distance section 43 remaining between first end 41 and second end 42, said distance section 43 being formed or insulated in such a way that an electrical connection between the first and second end can be established without an electrical connection between terminal lug 40 and screen 30. The arrangement comprises also insulation part 44 made of electrically insulating material, the insulating part being adapted to press against the surface formed by back-up battery 20 and terminal lug 40 (for example when housing 14 is closed). In the example in FIG. 4 insulating part 44 is formed by a circular disc made of insulating material, adapted to the outer diameter of the ring acting as a fixing part fixed to the interference screen. The insulating part is preferably elastic in order to facilitate staying in place and pressing firmly against the battery.

FIG. 5 shows an arrangement according to the invention with the back-up battery in place, for simplicity without other parts of the device, such as the equipment and the case. Interference screen 30 is adapted to connect the negative terminal of battery 20 to the circuit board, and circular fixing part of the screen 35 is adapted to insulate the negative terminal from the rest of the environment. Terminal lug 40 has been arranged to connect the positive terminal of battery 20 to connector 12 arranged on the circuit board, to which connector its second end 42 can be detachably fixed for example between pressure springs. Connector 12 is soldered to the circuit board by its contacts 51. Also the positive terminal remains at least partly inside the fixing part, and it is possible to press circular insulating part 44 from above on top of the positive terminal and the terminal lug. When the housing is closed the assembly is solid and the components stay well in place, and when the housing is opened the back-up power supply is easy to handle.

Figure 6:
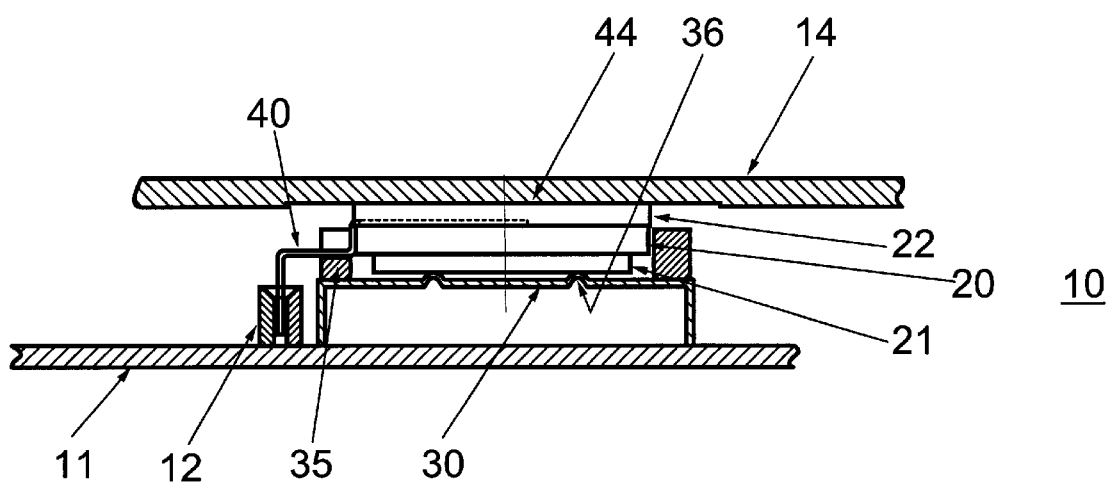
FIG. 6 shows as a cross section a second embodiment of the invention.

FIG. 6 shows as a cross section a second embodiment of the invention. As to other structural components the arrangement is similar to the example in FIG. 5, except that in order to secure the contact of the first terminal it has been arranged one or more knobs 36 in the interference screen 30. FIG. 6 also shows how housing 14 of the device can be set on top of insulating part 44 to keep parts 20, 40, 44 in place and to provide the pressing force required for establishing a good contact, if needed.

In the presented figures parts 20, 40 and 44 are shown as separate components from each other but integrating the parts is also possible. Integrated parts have to be replaced as an entity if one of the parts is damaged, but in most cases it can be done easily due to the small size and cheapness of the parts. For example battery 20 and terminal lug 40 may be welded together in order to secure the junction and to make assembly easier, and insulating part 44 may in manufacturing stage be attached to the former using tape in order to make replacing and other service operations easier.

The embodiment based upon structural fixing presented in FIG. 3 is preferable from the service and assembly point of view. In a solution according to the invention it is also possible to implement the connection between the battery and the screen using other methods. The battery can for example be fixed (for example by soldering) directly to the can part. Then insulating part 44 may be thinner, because it does not need to receive the pressing force of the cover. Because can part 31 is however detachable from frame part 32, the battery still is easily replaceable by replacing the combination of battery and can part. There are also other fixing methods, such as using one or more clamps. It is possible to implement the connection also as a mere combined effect of the pressing force of the cover and the terminal lug.

The above has been a presentation of implementing the invention and its embodiments utilizing examples. It is evident to a person skilled in the art that the invention is not limited to the details of the above embodiments and that the invention may be implemented also in other forms without deviating from the characteristics of the invention. For example the construction of the terminal lug can be chosen in a number of ways in addition to the one presented above. It is one possibility to form a connection between one terminal and the circuit board using a springing terminal lug and a contact point arranged directly on the circuit board.

Thus the presented embodiments should be regarded as illustrating, but not limiting, and the possibilities to implement and use the invention are limited only by the enclosed claims. Thus the different alternative embodiments specified in the claims, also equivalent embodiments are included in the scope of the invention.

What is claimed is:

1. An electronic device, comprising:
   a body:
   at least one circuit board supported by the body;
   a power supply, comprising a first terminal and a second terminal, the power supply being supported by the body;
   an electromagnetic interference screen supported by the body and positioned between the circuit board and the power supply;
   wherein the interference screen includes means for holding in place the power supply in regard to the body by fixing the power supply to the interference screen;
   the interference screen being configured to contact the first terminal of the power supply and the at least one circuit board for passing electrical power to the at least one circuit board.

2. A device according to claim 1 wherein
   the device further comprises a terminal lug electrically connected to the second terminal of the power supply for forming an electrical connection between the second terminal and the circuit board; and the circuit board comprises a contact point, the contact of which with the terminal lug makes said electrical connection between the second terminal and the circuit board.

3. A device according to claim 2, wherein the terminal lug comprises a rigid metal protrusion, and the contact point is a connector of the circuit board.

4. A device according to claim 2, wherein the terminal lug comprises a spring supported protrusion, and the contact point consists of a counterpoint arranged directly on the circuit board.

5. A device according to claim 1, wherein
   the means for fixing the power supply to the interference screen comprise a protrusion made of electrically insulating material and connected fixedly to the interference screen, the protrusion following the contours of a battery set in a certain position against the interference screen.

6. A device according to claim 1, wherein
   the device comprises a housing at least partly covering the circuit board in a certain position, and an insulating part made of electrically insulating material settling in said certain position between the housing and a power supply.

7. A device according to claim 6, wherein
   the power supply comprises at least one circular and essentially flat face;
   that the means for fixing the power supply to the interface screen comprise a circular protrusion fixed to the interference screen, following the circular form of a battery;
   the insulation part comprises a circular insulation patch matching the circular protrusion, and
   a terminal lug including a metal plate to be set between the flat face of the power supply and the insulation part.

8. A device according to claim 1, wherein
   the fixing part comprises knobs arranged in the surface of the interference screen, the screen further comprising at least one knob for contacting the first terminal of the power supply.

9. A device according to claim 6, wherein the power supply and the terminal lug are fixedly connected to each other.

10. A device according to claim 1, wherein
    said circuit board includes attached electronic components; said interference screen has been adapted, when attached, to cover the components; and the means for fixing the power supply to the interference screen are situated on the side opposite to the components.

11. A device according to claim 1, wherein the device is a mobile station.

12. An electronic device according to claim 1, wherein the power supply is a back-up battery.

13. An electronic device according to claim 1 further comprising a housing having an opened and a closed configuration, the housing being supported by the body in the closed configuration, wherein
    the battery and the electromagnetic interference screen are configured to form lock in place when the housing is in the closed configuration and to be released when the housing is in the opened configuration.

* * * * *